United States Patent
Bhattacharya et al.

(10) Patent No.: US 11,476,842 B1
(45) Date of Patent: Oct. 18, 2022

(54) SUPERCONDUCTING CURRENT SOURCE SYSTEM

(71) Applicants: Dipankar Bhattacharya, Macungie, PA (US); Donald L. Miller, Export, PA (US); Haitao O. Dai, Ellicott City, MD (US); Quentin P. Herr, Ellicott City, MD (US)

(72) Inventors: Dipankar Bhattacharya, Macungie, PA (US); Donald L. Miller, Export, PA (US); Haitao O. Dai, Ellicott City, MD (US); Quentin P. Herr, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 17/350,712

(22) Filed: Jun. 17, 2021

(51) Int. Cl.
*H03K 3/38* (2006.01)
*G06N 10/00* (2022.01)
*H03K 19/195* (2006.01)

(52) U.S. Cl.
CPC ............... *H03K 3/38* (2013.01); *G06N 10/00* (2019.01); *H03K 19/195* (2013.01)

(58) Field of Classification Search
CPC ......... H03K 3/38; H03K 19/195; G06N 10/00
USPC ........................................................ 327/528
See application file for complete search history.

(56) References Cited

U.S. PATENT DOCUMENTS

| | | | |
|---|---|---|---|
| 9,467,126 B1 * | 10/2016 | Naaman | H03K 3/38 |
| 10,122,350 B2 * | 11/2018 | Miller | H03K 3/38 |
| 10,367,483 B1 * | 7/2019 | Herr | G06N 10/00 |
| 10,389,336 B1 | 8/2019 | Miller et al. | |

* cited by examiner

*Primary Examiner* — Tomi Skibinski
(74) *Attorney, Agent, or Firm* — Tarolli, Sundheim, Covell & Tummino LLP

(57) ABSTRACT

One example describes a superconducting current source system comprising a linear flux-shuttle. The linear flux-shuttle includes an input and a plurality of Josephson transmission line (JTL) stages. Each of the JTL stages includes at least one Josephson junction, an output inductor, and a clock input. The linear flux-shuttle can be configured to generate a direct current (DC) output current via the output inductor associated with each of the JTL stages in response to the at least one Josephson junction triggering in a sequence in each of the JTL stages along the linear flux-shuttle in response to receiving an input pulse at the input and in response to a clock signal provided to the clock input in each of the JTL stages.

20 Claims, 4 Drawing Sheets

SUPERCONDUCTING CURRENT SOURCE SYSTEM

TECHNICAL FIELD

The present invention relates generally to superconducting circuits, and specifically to a linear flux pump current source system.

BACKGROUND

Superconducting digital technology has provided computing and/or communications resources that benefit from unprecedented high speed, low power dissipation, and low operating temperature. Superconducting digital technology has been developed as an alternative to CMOS technology, and typically comprises superconductor based single flux quantum superconducting circuitry, utilizing superconducting Josephson junctions, and can exhibit typical power dissipation of less than 1 nW (nanowatt) per active device at a typical data rate of 20 Gb/s (gigabits/second) or greater, and can operate at temperatures of around 4 Kelvin. Certain superconducting circuits in which Josephson junctions are the active devices can require a DC current bias of the Josephson junctions. Typical systems can provide the DC bias current directly using a bias resistor network, which can result in spurious magnetic fields and heat resulting from high power dissipation. The power budget in such circuits can be dominated by static power consumption, which can be dissipated in the bias resistor network whether or not the active device is switching.

SUMMARY

One example describes a superconducting current source system comprising a linear flux-shuttle. The linear flux-shuttle includes an input and a plurality of Josephson transmission line (JTL) stages. Each of the JTL stages includes at least one Josephson junction, an output inductor, and a clock input. The linear flux-shuttle can be configured to generate a direct current (DC) output current via the output inductor associated with each of the JTL stages in response to the at least one Josephson junction triggering in a sequence in each of the JTL stages along the linear flux-shuttle in response to receiving an input pulse at the input and in response to a clock signal provided to the clock input in each of the JTL stages.

Another example includes a method for generating a DC output current. The method includes providing an input pulse to an input of a linear flux-shuttle. The linear flux-shuttle includes a plurality of JTL stages. Each of the JTL stages includes at least one Josephson junction, an output inductor, and a clock input. The method also includes providing a clock signal to the clock input of each of the JTL stages to trigger the at least one Josephson junction in each of the JTL stages in a sequence along the linear flux-shuttle in response to the input pulse to generate a direct current (DC) output current via the output inductor associated with each of the JTL stages.

Another example includes a superconducting current source system. The system includes a first linear flux-shuttle and a second linear flux-shuttle. The first linear flux-shuttle includes a first input and a plurality of first JTL stages. Each of the first JTL stages includes at least one first Josephson junction, a first output inductor, and a first clock input. The second linear flux-shuttle includes a second input and a second plurality of JTL stages. Each of the second JTL stages includes at least one second Josephson junction, a second output inductor, and a second clock input. The system also includes an output. The first and second linear flux-shuttles can be configured to generate a DC output current on the output via the first output inductor associated with each of the first JTL stages and via the second output inductor associated with each of the second JTL stages in response to the respective at least one first and second Josephson junctions triggering in a sequence in each of the respective first and second JTL stages along the respective first and second linear flux-shuttles in response to receiving a first input pulse at the first input and a second input pulse at the second input and in response to the clock signal provided to the first and second clock inputs in each of the respective first and second JTL stages.

DETAILED DESCRIPTION

The present invention relates generally to superconducting circuits, and specifically to a linear flux pump current source system. The superconducting current source system includes at least one linear flux-shuttle. As described herein, the term "linear flux-shuttle" describes an arrangement of a plurality of Josephson transmission line (JTL) stages that are arranged in series between an input and a terminating end. For example, the terminating end can be arranged as a terminating resistor. Each of the JTL stages can be arranged to include at least one superconducting quantum interference device (SQUID), and thus includes at least one Josephson junction, as well as a clock input and an output inductor. As an example, the clock input can correspond to a secondary winding of a clock transformer (e.g., and a bias transformer) to inductively couple an AC clock signal to each JTL stage of the linear flux-shuttle, such that the AC clock signal provides a bias current to the respective JTL stage of the linear flux-shuttle. In response to an input pulse provided at the input of the linear flux-shuttle, and based on the bias provided by the clock signal via the clock input, the Josephson junction(s) of each of the JTL stages can trigger in a sequence along the linear flux-shuttle to provide an output current through the respective output inductor of each of the JTL stages.

As an example, the clock signal can be an AC clock signal (e.g., a quadrature clock signal, such as implemented in a reciprocal quantum logic (RQL) circuit). For example, the superconducting current source system can include a first linear flux-shuttle and a second linear flux-shuttle that are arranged substantially similarly, but are biased on opposite phases of the AC clock signal. Therefore, a first input pulse can be provided to the input of the first linear flux-shuttle to propagate along the JTL stages of the first linear flux-shuttle (e.g., via the triggering of respective Josephson junctions) at the first phase of the AC clock signal, and a second input pulse that is approximately 180° out-of-phase of the first input pulse can be provided at the input of the second linear flux-shuttle to propagate along the JTL stages of the second linear flux-shuttle (e.g., via the triggering of respective Josephson junctions) at the second phase of the AC clock signal that is likewise approximately 180° out-of-phase of the first phase of the AC clock signal. Furthermore, a given one of the first and second linear flux-shuttles can include phase boundaries, such that multiple sets of the JTL stages in the respective one of the first and second linear flux-shuttles can operate at different phases of the AC clock signal to provide the output current during the period of the AC clock signal.

Figure 1:
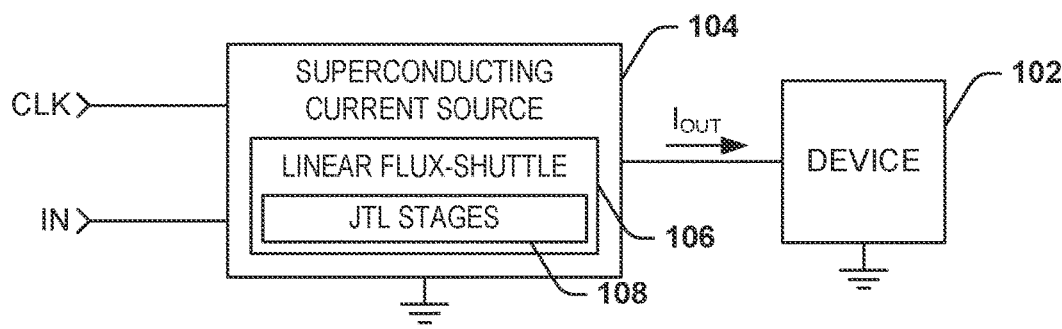
FIG. 1 illustrates an example of a superconducting circuit system.

FIG. 1 illustrates an example of a superconducting circuit system 100. As an example, the superconducting circuit system 100 can be implemented in any of a variety of superconductor computing applications, such as memory or processing systems. The superconducting circuit system 100 includes a device 102 that receives a DC output current, demonstrated in the example of FIG. 1 as a DC output current $I_{OUT}$. As an example, the DC output current $I_{OUT}$ can be provided as a driver signal to drive the device 102. For example, the device 102 can correspond to a memory driver, such as to provide a read current or a write current to a memory cell.

The superconducting circuit system 100 also includes a superconducting current source system 104 that is configured to generate the DC output current $I_{OUT}$ in response to an AC clock signal CLK that can correspond to a clock signal associated with the superconducting current source system 104. As an example, the clock signal CLK can be a sinusoidal waveform having a substantially constant frequency (e.g., approximately 5 GHz or 10 GHz) and an AC current magnitude. For example, the clock signal CLK can be provided as a quadrature clock signal, such as applicable to reciprocal quantum logic (RQL) superconducting circuits (e.g., approximately 2 mA RMS).

In the example of FIG. 1, the superconducting current source system 104 includes a linear flux-shuttle 106. The linear flux-shuttle 106 can include a plurality of JTL stages 108 that are configured to propagate a single-flux quantum (SFQ) pulse (e.g., fluxon) along the linear flux-shuttle 106 in response to an input pulse IN that is provided at an input of the linear flux-shuttle 106 and based on the clock signal CLK. As an example, each of the JTL stages 108 can be arranged to include at least one SQUID, and thus includes at least one Josephson junction, as well as a clock input and an output inductor. As described herein, the term "propagate" with respect to an SFQ pulse describes an SFQ pulse being generated via the triggering of the Josephson junction(s) in a given JTL stage 108 of the linear flux-shuttle, such that the voltage of the SFQ pulse, combined with a bias voltage (e.g., via the clock signal CLK), causes a Josephson junction of the next JTL stage 108 in the linear flux-shuttle to generate another SFQ pulse, and so on. Therefore, the input pulse IN can propagate as an SFQ pulse from the input, along the linear flux-shuttle 106, and to an end of the linear flux-shuttle 106 (e.g., a termination resistor). As an example, the clock input of each of the JTL stages 108 can include a clock transformer configured to inductively couple the clock signal CLK to the respective JTL stage 108 of the linear flux-shuttle 106, such that the clock signal CLK provides a bias current to the respective JTL stage 108. The output inductor associated with each of the JTL stages 108 is configured to provide the DC output current $I_{OUT}$ in response to propagating the SFQ pulse through the respective JTL stage 108. Thus, in response to the input pulse IN being provided to the input of the linear flux-shuttle 106, the Josephson junction(s) in each of the JTL stages 108 triggers sequentially to propagate the SFQ pulse along the linear flux-shuttle 106 based on the clock signal CLK. The SFQ pulse provides a voltage pulse to the output inductor associated with the respective JTL stage 108, such that each voltage pulse provides a current step as a portion of the DC output current $I_{OUT}$, such as in a load inductor (not shown). Therefore, the DC output current $I_{OUT}$ can be provided to the device 102 (e.g., via the load inductor) based on the current steps being sequentially provided based on the clock signal CLK. For example, the current steps can be generated based on voltage impulses generated from the triggering of the Josephson junctions, wherein the voltage steps have a voltage and time product of approximately 2 mV*ps. The currents provided to the output inductor associated with each of the JTL stages 108 that result from the voltage impulses are summed to provide the DC output current $I_{OUT}$.

Figure 2:
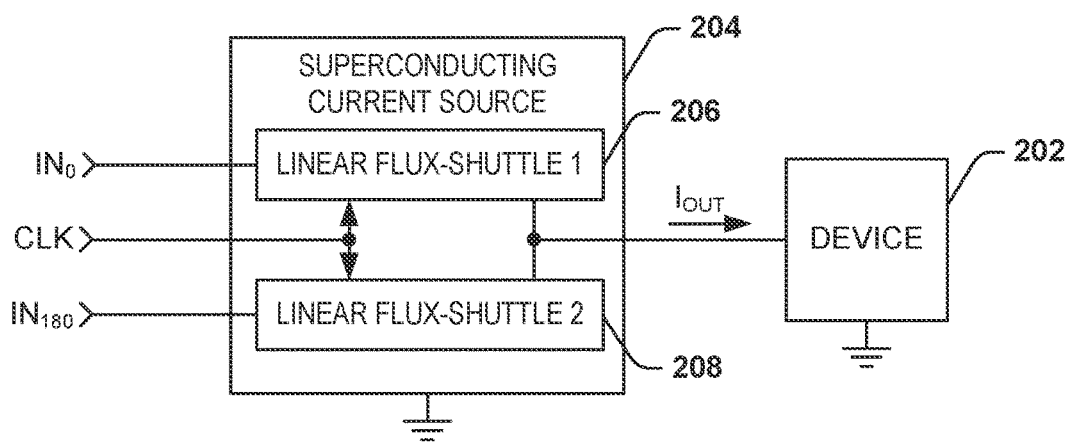
FIG. 2 illustrates another example of a superconducting circuit system.

FIG. 2 illustrates another example of a superconducting circuit system 200. Similar to as provided above in the example of FIG. 1, the superconducting circuit system 200 includes a device 202 that receives a DC output current, demonstrated in the example of FIG. 2 as a DC output current $I_{OUT}$. As an example, the DC output current $I_{OUT}$ can be provided as a driver signal to drive the device 202.

The superconducting circuit system 200 also includes a superconducting current source system 204 that is configured to generate the DC output current $I_{OUT}$ in response to an AC clock signal CLK that can correspond to a clock signal associated with the superconducting current source system 204. In the example of FIG. 2, the superconducting current source system 204 includes a first linear flux-shuttle 206 and a second linear flux-shuttle 208. Each of the first and second linear flux-shuttles 206 and 208 can be arranged substantially the same. Therefore, similar to as described above in the example of FIG. 1, each of the first and second linear flux-shuttles 206 and 208 include a plurality of JTL stages (not shown). For example, the first linear flux-shuttle 206 is configured to propagate an SFQ pulse (e.g., fluxon) along the first linear flux-shuttle 206 in response to a first input pulse $IN_0$ that is provided at an input of the first linear flux-shuttle 206 and based on the clock signal CLK. Similarly, the second linear flux-shuttle 208 is configured to propagate an SFQ pulse (e.g., fluxon) along the second linear flux-shuttle 208 in response to a second input pulse $IN_{180}$ that is provided at an input of the second linear flux-shuttle 208 and based on the clock signal CLK. As an example, the first and second input pulses $IN_0$ and $IN_{180}$ can be out-of-phase of each other by approximately 180°. As described above, the clock signal CLK can be an AC clock signal, such that the clock signal CLK can bias the JTL stages of the first linear flux-shuttle 206 in a first phase of the clock signal CLK to provide the output current $I_{OUT}$ via the first linear flux-shuttle 206 during the first phase of the clock signal CLK, and the clock signal CLK can bias the JTL stages of the second linear flux-shuttle 208 in a second phase of the clock signal CLK opposite the first phase to provide the output current $I_{OUT}$ via the second linear flux-shuttle 208 during the second phase of the clock signal CLK.

The first and second linear flux-shuttles 206 and 208 can be arranged substantially similar to the linear flux-shuttle 106 in the example of FIG. 1. Therefore, the clock input of each of the JTL stages of each of the first and second linear flux-shuttles 206 and 208 can include a clock transformer configured to inductively couple the clock signal CLK to the respective JTL stages of the respective first and second linear flux-shuttles 206 and 208. Additionally, the output inductor associated with each of the JTL stages of each of the respective first and second linear flux-shuttles 206 and 208 is configured to provide the DC output current $I_{OUT}$ in response to propagating the SFQ pulse through the respective JTL stages during the respective first and second phases of the clock signal CLK. Thus, in response to the input pulses $IN_0$ and $IN_{180}$ being provided to the respective inputs of the first and second linear flux-shuttles 206 and 208, the Josephson junction(s) in each of the JTL stages trigger sequentially to propagate the SFQ pulse along the first linear flux-shuttle 206 in the first phase of the clock signal CLK and along the second linear flux-shuttle 208 in the second phase of the clock signal CLK. Accordingly, the superconducting circuit system 200 can provide the output current $I_{OUT}$ from the first and second linear flux-shuttles 206 and 208 substantially continuously through the period of the clock signal CLK.

The superconducting current source system 204 provides for a superconductor current source that exhibits advantages over typical current source systems, such as those arranged in a flux-shuttle loop. For example, in circulating flux pumps, as current is diverted to the load, DC bias from the bias source can be depleted. At current compliance, at least one of the JTLs in the typical flux-shuttle loop can pulse in a positive sense during the crest of the AC bias, and pulse in a negative sense during the anti-crest of the AC bias, thus effecting a condition of dithering in which the embedded flux quanta stops circulating around the loop and current to the load stops increasing. The superconducting current source system 204 can operate without the occurrence of dithering based on the linear arrangement of the JTL stages in the first and second linear flux-shuttles 206 and 208. As another example, current compliance can be easily increased by adding additional JTL stages, and complementary biasing can be simplified over typical flux-shuttle loop arrangements as no cross-overs are required and additional JTL stages and/or phases may be added in increments of one. As yet another example, using a stream of SFQ pulses can simplify of activation of the superconducting current source system 204 relative to typical current sources that implement a flux-shuttle loop that require either off-chip activation or special dedicated circuits to initiate pumping, which could impact overall circuit performance. As yet another example, the first and second linear flux-shuttles 206 and 208 being arranged as mirror-image linear circuits simplifies the circuit layout, allowing for trivial scalability to make use of available circuit footprint and to improve pitch matching in arrayed circuits (e.g., memory). As yet a further example, as opposed to the circular arrangement of the typical flux-shuttle loop arrangement, the linear arrangement of the JTL stages in the linear flux-shuttles 206 and 208 mitigates the possibility of trapping background flux quanta, which can deleteriously affect the performance of the circuit. Accordingly, the superconducting current source system 204 can exhibit significant advantages over the typical current source that implements a flux-shuttle loop.

Figure 3:
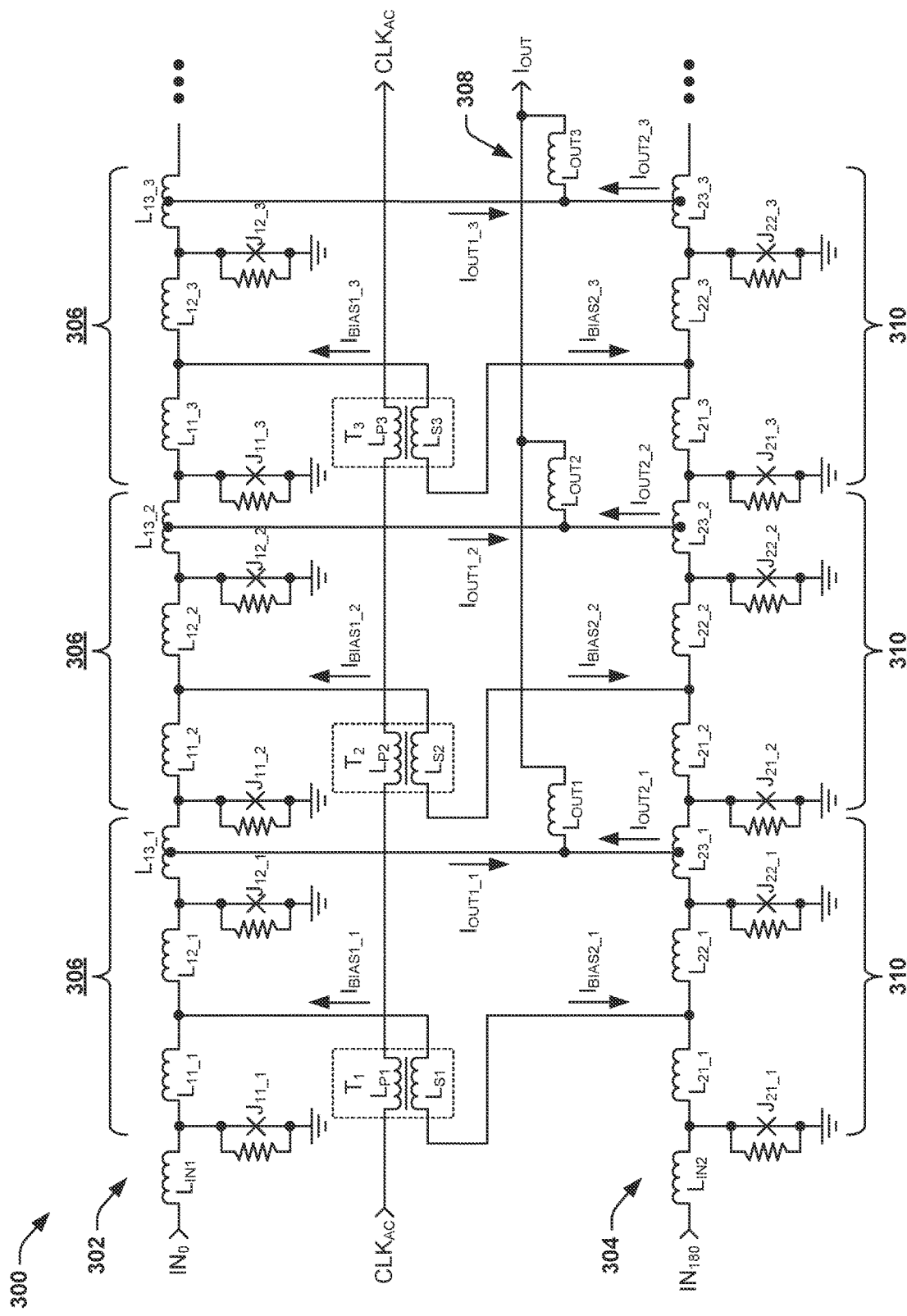
FIG. 3 illustrates an example of a superconducting current source circuit.

FIG. 3 illustrates an example of a superconducting current source circuit 300. The superconducting current source circuit 300 can correspond to superconducting current source system 104 or the superconducting current source system 204 in the superconducting circuit systems 100 and 200, respectively. Therefore, reference is to be made to the example of FIGS. 1 and 2 in the following description of the example of FIG. 3.

The superconducting current source circuit 300 includes a first linear flux-shuttle 302 and a second linear flux-shuttle 304. Each of the first and second linear flux-shuttles 302 and 304 are arranged approximately identically. The first linear flux-shuttle 302 includes an input inductor $L_{IN1}$, and includes a plurality of JTL stages 306. Each of the JTL stages 306 includes a first inductor $L_{11\_X}$, a second inductor $L_{12\_X}$, and a third inductor $L_{13\_X}$. In the example of FIG. 3, the designation "X" is an index corresponding to the number of the JTL stage to a total quantity of N stages. Therefore, the first inductors number $L_{11\_1}$ through $L_{11\_N}$, the second inductors number $L_{12\_1}$ through $L_{12\_N}$, and the third inductors number $L_{13\_1}$ through $L_{13\_N}$. Each of the JTL stages 306 also includes a first Josephson junction $J_{11\_X}$ and a second Josephson junction $J_{12\_X}$. In the example of FIG. 3, the Josephson junctions $J_{11\_X}$ and $J_{12\_X}$ are demonstrated as shunted Josephson junctions, and therefore include a parallel resistor.

Each of the JTL stages 306 also includes a clock input, demonstrated in the example of FIG. 3 as a first polarity of a secondary winding $L_{SX}$ of a transformer $T_X$. The primary winding $L_{PX}$ of each of the transformers $T_X$ is provided a clock signal $CLK_{AC}$, which can be a sinusoidal clock signal. The first and second inductors $L_{11\_X}$ and $L_{12\_X}$ and the first and second Josephson junctions $J_{11\_X}$ and $J_{12\_X}$ therefore form a SQUID that is biased by a bias current $I_{BIAS1\_X}$ that is provided via the secondary winding $L_{SX}$ during a first phase of the clock signal $CLK_{AC}$. Additionally, each of the JTL stages 306 includes an output inductor $L_{OUTX}$ that is coupled to the respective third inductor $L_{13\_X}$ of the respective JTL stage 306. The output inductor $L_{OUTX}$ of each of the JTL stages 306 is coupled to an output 308 that is configured to provide the output current $I_{OUT}$, as described in greater detail herein.

Similarly, the second linear flux-shuttle 304 includes an input inductor $L_{IN2}$, and includes a plurality of JTL stages 310. Each of the JTL stages 310 includes a first inductor $L_{21\_X}$, a second inductor $L_{22\_X}$, and a third inductor $L_{23\_X}$. Therefore, the first inductors number $L_{21\_1}$ through $L_{21\_N}$, the second inductors number $L_{22\_1}$ through $L_{22\_N}$, and the third inductors number $L_{23\_1}$ through $L_{23\_N}$. Each of the JTL stages 310 also includes a first Josephson junction $J_{21\_X}$ and a second Josephson junction $J_{22\_X}$. In the example of FIG. 3, the Josephson junctions $J_{21\_X}$ and $J_{22\_X}$ are demonstrated as shunted Josephson junctions, and therefore include a parallel resistor.

Each of the JTL stages 310 also includes a clock input, demonstrated in the example of FIG. 3 as a second polarity, opposite the first polarity, of the secondary winding $L_{SX}$ of a transformer $T_X$. Therefore, each of the JTL stages 306 and 310 share a common clock input $L_{SX}$ based on being provided the respective bias currents from the opposing polarities of the secondary winding $L_{SX}$ of a transformer $T_X$. However, separate clock inputs (e.g., separate transformers) can be provided to the respective JTL stages 306 and 310. The first and second inductors $L_{21\_X}$ and $L_{22\_X}$ and the first and second Josephson junctions $J_{21\_X}$ and $J_{22\_X}$ therefore form a SQUID that is biased by a bias current $I_{BIAS2\_X}$ that is provided via the secondary winding $L_{SX}$ during a second phase of the clock signal $CLK_{AC}$ opposite the first phase. Therefore, the bias current $I_{BIAS2\_X}$ has an opposite polarity as the bias current $I_{BIAS1\_X}$. Additionally, each of the JTL stages 310 includes the output inductor $L_{OUTX}$ that is coupled to the respective third inductor $L_{23\_X}$ of the respective JTL stage 310. Therefore, each of the JTL stages 306 and 310 share a common output inductor $L_{OUTX}$. However, separate output inductors can be coupled to the respective JTL stages 306 and 310.

In the example of FIG. 3, an input pulse $IN_0$ (e.g., an SFQ pulse) is provided to an input 312 of the first linear flux-shuttle 302. The input pulse $IN_0$ propagates through the input inductor $L_{IN1}$ to the SQUID formed by the first and second inductors $L_{11\_1}$ and $L_{12\_1}$ and the first and second Josephson junctions $J_{11\_1}$ and $J_{12\_1}$. During the first phase of the clock signal $CLK_{AC}$, the secondary winding $L_{S1}$ of the first transformer $T_1$ provides the bias current $I_{BIAS1\_1}$ to the first JTL stage 306. Accordingly, the first and second Josephson junctions $J_{11\_1}$ and $J_{12\_1}$ trigger to propagate the SFQ pulse to the second JTL stage 306. Additionally, a current step $I_{OUT1\_1}$ corresponding to a portion of the SFQ pulse is provided from the first JTL stage 306 as the SFQ pulse propagates through the third inductor $L_{13\_1}$. The current $I_{OUT1\_1}$ is provided to the output 308 via the output inductor $L_{OUT1}$, and therefore forms a portion of the output current $I_{OUT}$. As an example, the current step $I_{OUT1\_1}$ can be added to energy stored in a storage inductor (not shown) that can provide the output current $I_{OUT}$ to a load.

The SFQ pulse can thus continue to propagate along the first linear flux-shuttle 302. For example, the SFQ pulse propagates to each SQUID formed by the first and second inductors $L_{11\_X}$ and $L_{12\_X}$ and the first and second Josephson junctions $J_{11\_X}$ and $J_{12\_X}$ in the sequence of JTL stages 306. During the first phase of the clock signal $CLK_{AC}$, the secondary winding $L_{SX}$ of the respective transformer $T_X$ provides the bias current $I_{BIAS1\_X}$ to the respective JTL stage 306. Accordingly, the first and second Josephson junctions $J_{11\_X}$ and $J_{12\_X}$ trigger to propagate the SFQ pulse to the next JTL stage 306 of the sequence of JTL stages 306. In each JTL stage 306, a current step $I_{OUT1\_X}$ corresponding to a portion of the SFQ pulse is provided from the respective JTL stage 306 as the SFQ pulse propagates through the third inductor $L_{13\_X}$. The current $I_{OUT1\_X}$ is provided to the output 308 via the respective output inductor $L_{OUTX}$, and therefore forms a portion of the output current $I_{OUT}$.

In the second phase of the clock signal $CLK_{AC}$, an input pulse $IN_{180}$ (e.g., an SFQ pulse) is provided to an input 314 of the second linear flux-shuttle 304. The input pulse $IN_{180}$ can be approximately 180° out-of-phase of the input pulse $IN_0$, and therefore approximately aligned with the second phase of the clock signal $CLK_{AC}$. The input pulse $IN_{180}$ propagates through the input inductor $L_{IN2}$ to the SQUID formed by the first and second inductors $L_{21\_1}$ and $L_{22\_1}$ and the first and second Josephson junctions $J_{21\_1}$ and $J_{22\_1}$. During the second phase of the clock signal $CLK_{AC}$, the secondary winding $L_{S1}$ of the first transformer $T_1$ provides the bias current $I_{BIAS2\_1}$ to the first JTL stage 310. Accordingly, the first and second Josephson junctions $J_{21\_1}$ and $J_{22\_1}$ trigger to propagate the SFQ pulse to the second JTL stage 310. Additionally, a current step $I_{OUT2\_1}$ corresponding to a portion of the SFQ pulse is provided from the first JTL stage 310 as the SFQ pulse propagates through the third inductor $L_{23\_1}$. The current $I_{OUT2\_1}$ is provided to the output 308 via the output inductor $L_{OUT1}$, and therefore forms a portion of the output current $I_{OUT}$. As an example, the current step $I_{OUT2\_1}$ can be added to energy stored in the storage inductor that can provide the output current $I_{OUT}$ to a load.

The SFQ pulse can thus continue to propagate along the second linear flux-shuttle 304. For example, the SFQ pulse propagates to each SQUID formed by the first and second inductors $L_{21\_X}$ and $L_{22\_X}$ and the first and second Josephson junctions $J_{21\_X}$ and $J_{22\_X}$ in the sequence of JTL stages 310. During the second phase of the clock signal $CLK_{AC}$, the secondary winding $L_{SX}$ of the respective transformer $T_X$ provides the bias current $I_{BIAS2\_X}$ to the respective JTL stage 310. Accordingly, the first and second Josephson junctions $J_{21\_X}$ and $J_{22\_X}$ trigger to propagate the SFQ pulse to the next JTL stage 310 of the sequence of JTL stages 310. In each JTL stage 310, a current step $I_{OUT2\_X}$ corresponding to a portion of the SFQ pulse is provided from the respective JTL stage 310 as the SFQ pulse propagates through the third inductor $L_{23\_X}$. The current $I_{OUT1\_X}$ is provided to the output 308 via the respective output inductor $L_{OUT\_X}$, and therefore forms a portion of the output current $I_{OUT}$.

Figure 4:
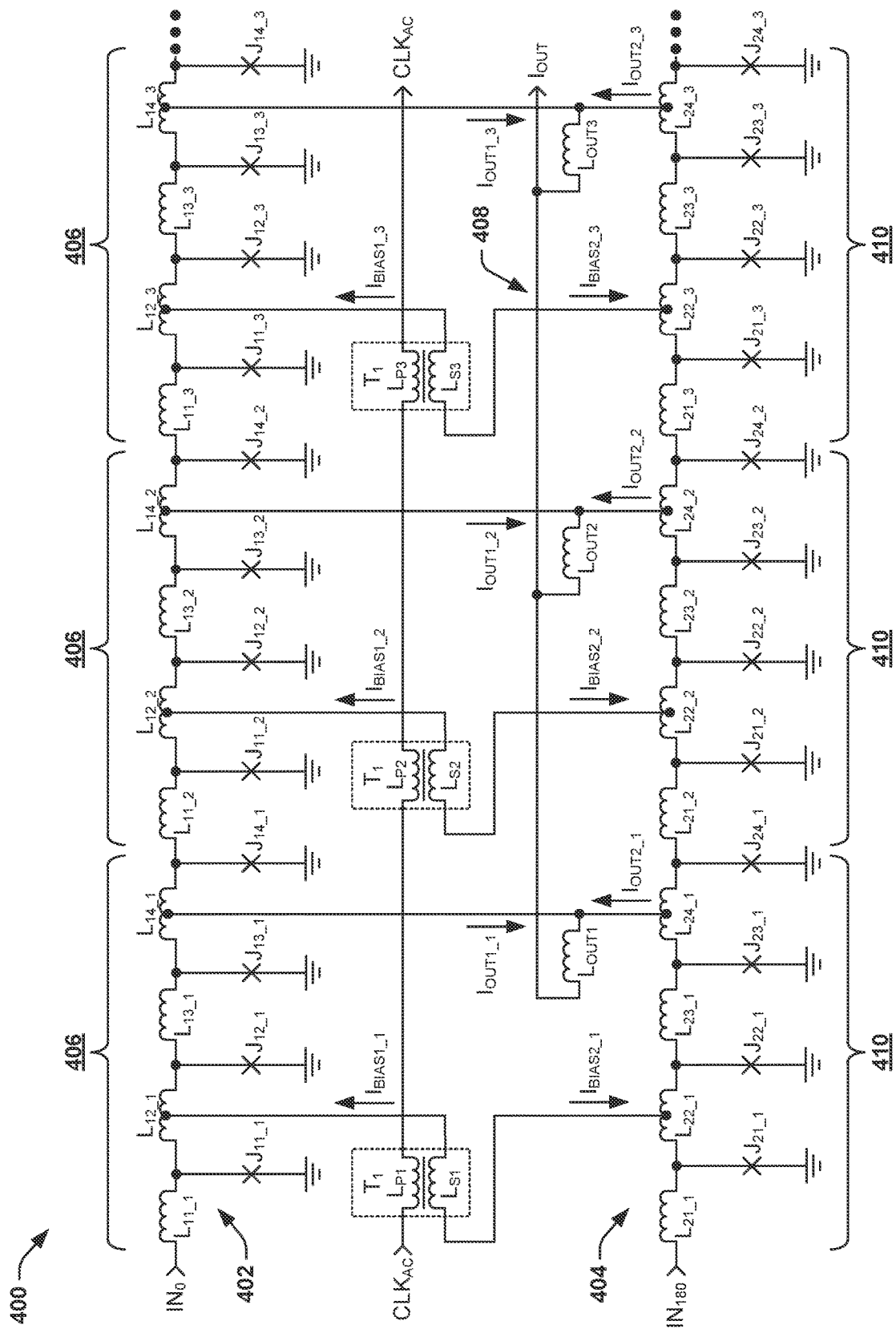
FIG. 4 illustrates another example of a superconducting current source circuit.

FIG. 4 illustrates an example of a superconducting current source circuit 400. The superconducting current source circuit 400 can correspond to superconducting current source system 104 or the superconducting current source system 204 in the superconducting circuit systems 100 and 200, respectively. Therefore, reference is to be made to the example of FIGS. 1 and 2 in the following description of the example of FIG. 4.

The superconducting current source circuit 400 includes a first linear flux-shuttle 402 and a second linear flux-shuttle 404. Each of the first and second linear flux-shuttles 402 and 404 are arranged approximately identically. The first linear flux-shuttle 402 includes a plurality of JTL stages 406. Each of the JTL stages 406 includes a first inductor $L_{11\_X}$, a second inductor $L_{12\_X}$, a third inductor $L_{13\_X}$, and a fourth inductor $L_{14\_X}$. In the example of FIG. 4, the designation "X" is an index corresponding to the number of the JTL stage to a total quantity of N stages. Therefore, the first inductors number $L_{11\_1}$ through $L_{11\_N}$, the second inductors number $L_{12\_1}$ through $L_{12\_N}$, the third inductors number $L_{13\_1}$ through $L_{13\_N}$, and the fourth inductors number $L_{14\_1}$ through $L_{14\_N}$. Each of the JTL stages 406 also includes a first Josephson junction $J_{11\_X}$, a second Josephson junction $J_{12\_X}$, a third Josephson junction $J_{13\_X}$, and a fourth Josephson junction $J_{14\_X}$. In the example of FIG. 4, the Josephson junctions $J_{11\_X}$, $J_{12\_X}$, $J_{13\_X}$, and $J_{14\_X}$ are demonstrated as unshunted Josephson junctions, and therefore do not include a parallel resistor.

Each of the JTL stages 406 also includes a clock input, demonstrated in the example of FIG. 4 as a first polarity of a secondary winding $L_{SX}$ of a transformer $T_X$. The primary winding $L_{PX}$ of each of the transformers $T_X$ is provided a clock signal $CLK_{AC}$, which can be a sinusoidal clock signal. The arrangement of the inductors $L_{11\_X}$, $L_{12\_X}$, $L_{13\_X}$, and $L_{14\_X}$ and the Josephson junctions $J_{11\_X}$, $J_{12\_X}$, $J_{13\_X}$, and $J_{14\_X}$ form an equivalent long Josephson junction that provides a variable flux along the length of the respective JTL stage 406, as opposed to the digital flux quanta provided by the SQUID arrangement of the JTL stages 306 in the example of FIG. 3. As described herein, the term "equivalent long Josephson junction" refers to a series of SQUIDs in each of the JTL stages 406 that each store less than a flux quantum based on a product of the critical current of a given one of the Josephson junctions $J_{11\_X}$, $J_{12\_X}$, $J_{13\_X}$, and $J_{14\_X}$ and the inductance of a respective one of the inductors $L_{11\_X}$, $L_{12\_X}$, $L_{13\_X}$, and $L_{14\_X}$ of the SQUID being less than a flux quantum (e.g., less than one quarter of a flux quantum). While the equivalent long Josephson junction demonstrated in the example of FIG. 4 includes four Josephson junctions and four inductors, each of the JTL stages 406 can include more than or fewer than four Josephson junctions and four inductors to be implemented as an equivalent long Josephson junction as described herein.

As a result, the Josephson junctions $J_{11\_X}$, $J_{12\_X}$, $J_{13\_X}$, and $J_{14\_X}$ exhibit a superconducting phase of approximately $2\pi$ over multiple Josephson junctions $J_{11\_X}$, $J_{12\_X}$, $J_{13\_X}$, and $J_{14\_X}$ in the JTL stage 406, as opposed to each of the Josephson junctions $J_{11\_X}$, $J_{12\_X}$, $J_{13\_X}$, and $J_{14\_X}$. In the example of FIG. 4, the equivalent long Josephson junction arrangement of the JTL stages 406 is biased by a bias current $I_{BIAS1\_X}$ that is provided via the secondary winding $L_{SX}$ to the second inductor $L_{12\_X}$ during a first phase of the clock signal $CLK_{AC}$. Additionally, each of the JTL stages 406 includes an output inductor $L_{OUT\_X}$ that is coupled to the respective fourth inductor $L_{14\_X}$ of the respective JTL stage 406. The output inductor $L_{OUT\_X}$ of each of the JTL stages 406 is coupled to an output 408 that is configured to provide the output current $I_{OUT}$, as described in greater detail herein.

Similarly, the second linear flux-shuttle 404 includes a plurality of JTL stages 410. Each of the JTL stages 410 includes a first inductor $L_{21\_X}$, a second inductor $L_{22\_X}$, a third inductor $L_{23\_X}$, and a fourth inductor $L_{24\_X}$. Therefore, the first inductors number $L_{21\_1}$ through $L_{21\_N}$, the second inductors number $L_{22\_1}$ through $L_{22\_N}$, the third inductors number $L_{23\_1}$ through $L_{23\_N}$, and the fourth inductors number $L_{24\_1}$ through $L_{24\_N}$. Each of the JTL stages 410 also includes a first Josephson junction $J_{21\_X}$, a second Josephson junction $J_{22\_X}$, a third Josephson junction $J_{23\_X}$, and a fourth Josephson junction $J_{24\_X}$. In the example of FIG. 4, the Josephson junctions $J_{21\_X}$, $J_{22\_X}$, $J_{23\_X}$, and $J_{24\_X}$ are demonstrated as unshunted Josephson junctions, and therefore do not include a parallel resistor.

Each of the JTL stages 410 also includes a clock input, demonstrated in the example of FIG. 4 as a second polarity, opposite the first polarity, of the secondary winding $L_{SX}$ of a transformer $T_X$. Therefore, each of the JTL stages 406 and 410 share a common clock input $L_{SX}$ based on being provided the respective bias currents from the opposing polarities of the secondary winding $L_{SX}$ of a transformer $T_X$. However, separate clock inputs (e.g., separate transformers) can be provided to the respective JTL stages 406 and 410. Similar to as described above, the arrangement of the inductors $L_{21\_X}$, $L_{22\_X}$, $L_{23\_X}$, and $L_{24\_X}$ and the Josephson junctions $J_{21\_X}$, $J_{22\_X}$, $J_{23\_X}$, and $J_{24\_X}$ form an equivalent long Josephson junction that provides a variable flux along the length of the respective JTL stage 410, as opposed to the digital flux quanta provided by the SQUID arrangement of the JTL stages 310 in the example of FIG. 3. The equivalent long Josephson junction arrangement of the JTL stages 410 is biased by a bias current $I_{BIAS2\_X}$ that is provided via the secondary winding $L_{SX}$ to the second inductor $L_{12\_X}$ during a second phase of the clock signal $CLK_{AC}$. Therefore, the bias current $I_{BIAS2\_X}$ has an opposite polarity as the bias current $I_{BIAS1\_X}$. Additionally, each of the JTL stages 406 includes an output inductor $L_{OUT\_X}$ that is coupled to the respective fourth inductor $L_{14\_X}$ of the respective JTL stage 406. The output inductor $L_{OUTX}$ of each of the JTL stages 410 is coupled to the output 408. Therefore, each of the JTL stages 406 and 410 share a common output inductor $L_{OUTX}$. However, separate output inductors can be coupled to the respective JTL stages 406 and 410.

In the example of FIG. 4, an input pulse $IN_0$ (e.g., an SFQ pulse) is provided to an input 412 of the first flux-shuttle 402. The input pulse $IN_0$ propagates to the equivalent long Josephson junction arrangement formed by the inductors $L_{11\_1}$, $L_{12\_1}$, $L_{13\_1}$, and $L_{14\_1}$ and the Josephson junctions $J_{11\_1}$, $J_{12\_1}$, $J_{13\_1}$, and $J_{14\_1}$ in the first JTL stage 406. During the first phase of the clock signal $CLK_{AC}$, the secondary winding $L_{S1}$ of the first transformer $T_1$ provides the bias current $I_{BIAS1\_1}$ to the first JTL stage 406. Accordingly, the Josephson junctions $J_{11\_1}$, $J_{12\_1}$, $J_{13\_1}$, and $J_{14\_1}$ trigger to propagate the SFQ pulse to the second JTL stage 406. Additionally, a current step $I_{OUT1\_1}$ corresponding to a portion of the SFQ pulse is provided from the first JTL stage 406 as the SFQ pulse propagates through the fourth inductor $L_{14\_1}$. Because of the equivalent long Josephson junction arrangement of the first JTL stage 406, the current step $I_{OUT1\_1}$ can be provided in a variable amplitude as the flux in the equivalent long Josephson junction changes as the SFQ pulse propagates through the first JTL stage 406. The current $I_{OUT1\_1}$ is provided to the output 408 via the output inductor $L_{OUT1}$, and therefore forms a portion of the output current $I_{OUT}$. As an example, the current step $I_{OUT1\_1}$ can be added to energy stored in a storage inductor (not shown) that can provide the output current $I_{OUT}$ to a load.

The SFQ pulse can thus continue to propagate along the first linear flux-shuttle 402. For example, the SFQ pulse propagates to each JTL stage 406 in the sequence of JTL stages 406. During the first phase of the clock signal $CLK_{AC}$, the secondary winding $L_{SX}$ of the respective transformer $T_X$ provides the bias current $I_{BIAS1\_X}$ to the respective JTL stage 406. Accordingly, the Josephson junctions $J_{11\_X}$, $J_{12\_X}$, $J_{13\_X}$, and $J_{14\_X}$ trigger to propagate the SFQ pulse to the next JTL stage 406 of the sequence of JTL stages 406. In each JTL stage 406, a variable current step $I_{OUT1\_X}$ corresponding to a portion of the SFQ pulse is provided from the respective JTL stage 406 as the SFQ pulse propagates through the fourth inductor $L_{14\_X}$. The current $I_{OUT1\_X}$ is provided to the output 408 via the respective output inductor $L_{OUTX}$, and therefore forms a portion of the output current $I_{OUT}$.

In the second phase of the clock signal $CLK_{AC}$, an input pulse $IN_{180}$ (e.g., an SFQ pulse) is provided to an input 414 of the second linear flux-shuttle 404. The input pulse $IN_{180}$ can be approximately 180° out-of-phase of the input pulse $IN_0$, and therefore approximately aligned with the second phase of the clock signal $CLK_{AC}$. The input pulse $IN_{180}$ propagates to the equivalent long Josephson junction arrangement formed by the inductors $L_{21\_1}$, $L_{22\_1}$, $L_{23\_1}$, and $L_{24\_1}$ and the Josephson junctions $J_{21\_1}$, $J_{22\_1}$, $J_{23\_1}$, and $J_{24\_1}$ in the first JTL stage 410. During the second phase of the clock signal $CLK_{AC}$, the secondary winding $L_{S1}$ of the first transformer $T_1$ provides the bias current $I_{BIAS2\_1}$ to the first JTL stage 410. Accordingly, the Josephson junctions $J_{21\_1}$, $J_{22\_1}$, $J_{23\_1}$, and $J_{24\_1}$ trigger to propagate the SFQ pulse to the second JTL stage 410. Additionally, a variable current step $I_{OUT2\_1}$ corresponding to a portion of the SFQ pulse is provided from the first JTL stage 410 as the SFQ pulse propagates through the fourth inductor $L_{24\_1}$. The current $I_{OUT2\_1}$ is provided to the output 408 via the output inductor $L_{0am}$, and therefore forms a portion of the output current $I_{OUT}$. As an example, the current step $I_{OUT2\_1}$ can be added to energy stored in the storage inductor that can provide the output current $I_{OUT}$ to a load.

The SFQ pulse can thus continue to propagate along the second linear flux-shuttle 404. For example, the SFQ pulse propagates to each JTL stage 410 in the sequence of JTL stages 410. During the second phase of the clock signal $CLK_{AC}$, the secondary winding $L_{SX}$ of the respective transformer $T_X$ provides the bias current $I_{BIAS2\_X}$ to the respective JTL stage 410. Accordingly, the Josephson junctions $J_{21\_X}$, $J_{22\_X}$, $J_{23\_X}$, and $J_{24\_X}$ trigger to propagate the SFQ pulse to the next JTL stage 410 of the sequence of JTL stages 410. In each JTL stage 410, a variable current step $I_{OUT2\_X}$ corresponding to a portion of the SFQ pulse is provided from the respective JTL stage 410 as the SFQ pulse propagates through the fourth inductor $L_{24\_X}$. The current $I_{OUT2\_X}$ is provided to the output 408 via the respective output inductor $L_{OUT\_X}$, and therefore forms a portion of the output current $I_{OUT}$.

The example of FIG. 4 therefore demonstrates a variation of the linear flux-shuttles 402 and 404 relative to the linear flux-shuttles 302 and 304 in the example of FIG. 3. The equivalent long Josephson junction arrangement of the inductors $L_{11\_X}$, $L_{12\_X}$, $L_{13\_X}$, and $L_{14\_X}$ and the Josephson junctions $J_{11\_X}$, $J_{12\_X}$, $J_{13\_X}$, and $J_{14\_X}$, and the equivalent long Josephson junction arrangement of the inductors $L_{21\_X}$, $L_{22\_X}$, $L_{23\_X}$, and $L_{24\_X}$ and the Josephson junctions $J_{21\_X}$, $J_{22\_X}$, $J_{23\_X}$, and $J_{24\_X}$ enables operation of the superconducting current source system 400 to operate without shunted Josephson junctions. As a result, the superconducting current source system 400 can operate in a more energy efficient manner based on mitigating energy dissipation from resistive shunts on the respective Josephson junctions $J_{11\_X}$, $J_{12\_X}$, $J_{13\_X}$, and $J_{14\_X}$ and $J_{21\_X}$, $J_{22\_X}$, $J_{23\_X}$, and $J_{24\_X}$. Furthermore, the superconducting current source system 400 can be fabricated in a more compact form-factor by not including resistive shunts on the respective Josephson junctions $J_{11\_X}$, $J_{12\_X}$, $J_{13\_X}$, and $J_{14\_X}$ and $J_{21\_X}$, $J_{22\_X}$, $J_{23\_X}$, and $J_{24\_X}$.

Figure 5:
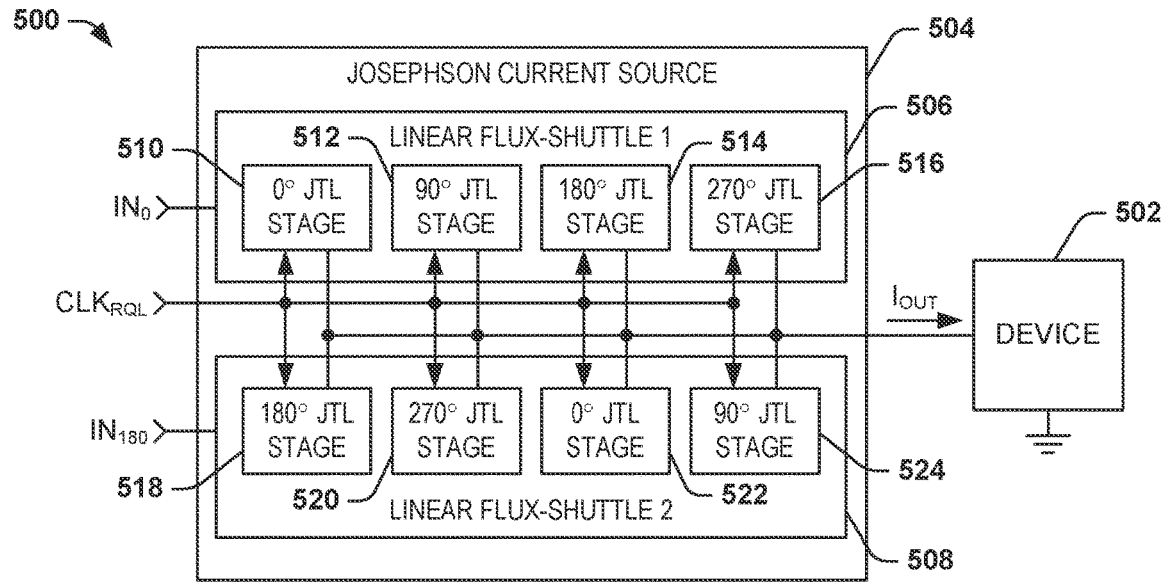
FIG. 5 illustrates another example of a superconducting circuit system.

FIG. 5 illustrates another example of a superconducting circuit system 500. Similar to as provided above in the examples of FIGS. 1 and 2, the superconducting circuit system 500 includes a device 502 that receives a DC output current, demonstrated in the example of FIG. 5 as a DC output current $I_{OUT}$. As an example, the DC output current $I_{OUT}$ can be provided as a driver signal to drive the device 502.

The superconducting circuit system 500 also includes a superconducting current source system 504 that is configured to generate the DC output current $I_{OUT}$ in response to an AC clock signal CLK that can correspond to a clock signal associated with the superconducting current source system 504. In the example of FIG. 5, the superconducting current source system 504 includes a first linear flux-shuttle 506 and a second linear flux-shuttle 508. Each of the first and second linear flux-shuttles 506 and 508 can be arranged substantially the same. Therefore, similar to as described above in the example of FIGS. 1 and 2, each of the first and second linear flux-shuttles 506 and 508 include a plurality of JTL stages (not shown). Similar to as described above, the first and second linear flux-shuttles 506 and 508 can operate based on an AC clock signal. However, in the example of FIG. 5, the AC clock signal, demonstrated as a clock signal $CLK_{RQL}$, can correspond to a quadrature clock signal that can include two separate sinusoidal signals that are 90° out-of-phase with respect to each other, such as implemented in an RQL circuit system.

In the example of FIG. 5, the first linear flux-shuttle 506 includes a plurality of sets of phased JTL stages, demonstrated as a first set of phased JTL stages 510 that operate at the 0° phase of the clock signal $CLK_{RQL}$ ("0° JTL STAGE"), a second set of phased JTL stages 512 that operate at the 90° phase of the clock signal $CLK_{RQL}$ ("90° JTL STAGE"), a third set of phased JTL stages 514 that operate at 180° phase of the clock signal $CLK_{RQL}$ ("180° JTL STAGE"), and a fourth set of phased JTL stages 516 that operate at the 270° phase of the clock signal $CLK_{RQL}$ ("270° JTL STAGE"). For example, the first linear flux-shuttle 506 is configured to propagate an SFQ pulse (e.g., fluxon) along the first linear flux-shuttle 506 in response to a first input pulse $IN_0$ that is provided at an input of the first linear flux-shuttle 506 and based on the clock signal $CLK_{RQL}$. As an example, the first set of phased JTL stages 510 provides the output current $I_{OUT}$ to the device 502 during the 0° phase of the clock signal $CLK_{RQL}$, the second set of phased JTL stages 512 provides the output current $I_{OUT}$ to the device 502 during the 90° phase of the clock signal $CLK_{RQL}$, the third set of phased JTL stages 514 provides the output current $I_{OUT}$ to the device 502 during the 180° phase of the clock signal $CLK_{RQL}$, and the fourth set of phased JTL stages 516 provides the output current $I_{OUT}$ to the device 502 during the 270° phase of the clock signal $CLK_{RQL}$. Therefore, the first linear flux-shuttle 506 includes phase boundaries that allow for continuously providing output current to the device 502 through the entire period of a quadrature clock signal (e.g., the clock signal $CLK_{RQL}$).

Similarly, the second linear flux-shuttle 508 includes a plurality of sets of phased JTL stages, demonstrated as a first set of phased JTL stages 518 that operate at the 180° phase of the clock signal $CLK_{RQL}$ ("180° JTL STAGE"), a second set of phased JTL stages 520 that operate at the 270° phase of the clock signal $CLK_{RQL}$ ("270° JTL STAGE"), a third set of phased JTL stages 522 that operate at 0° phase of the clock signal $CLK_{RQL}$ ("0° JTL STAGE"), and a fourth set of phased JTL stages 524 that operate at the 90° phase of the clock signal $CLK_{RQL}$ ("90° JTL STAGE"). For example, the second linear flux-shuttle 508 is configured to propagate an SFQ pulse (e.g., fluxon) along the second linear flux-shuttle 508 in response to a second input pulse $IN_{180}$ that is provided at an input of the second linear flux-shuttle 508 and based on the clock signal $CLK_{RQL}$. As an example, the first set of phased JTL stages 518 provides the output current $I_{OUT}$ to the device 502 during the 180° phase of the clock signal $CLK_{RQL}$, the second set of phased JTL stages 520 provides the output current $I_{OUT}$ to the device 502 during the 270° phase of the clock signal $CLK_{RQL}$, the third set of phased JTL stages 522 provides the output current $I_{OUT}$ to the device 502 during the 0° phase of the clock signal $CLK_{RQL}$, and the fourth set of phased JTL stages 524 provides the output current $I_{OUT}$ to the device 502 during the 90° phase of the clock signal $CLK_{RQL}$. Therefore, the second linear flux-shuttle 508 also includes phase boundaries that allow for continuously providing output current to the device 502 through the entire period of a quadrature clock signal (e.g., the clock signal $CLK_{RQL}$).

The number of JTL stages in each of the sets of phased JTL stages 510, 512, 514, 516, 518, 520, 522, and 524 can be based on a propagation time of the SFQ pulse relative to the frequency of the clock signal $CLK_{RQL}$ (e.g., up to approximately fifteen JTL stages). Therefore, the first and second linear flux-shuttles 506 and 508 can be expandable by any quantity of JTL stages that can be divided into sets of phased JTL stages. Based on the arrangement of the sets of phased JTL stages in the first and second linear flux-shuttles 506 and 508, the superconducting current source system 504 can substantially continuously provide output current to the device 502 through the entire period of a quadrature clock signal (e.g., the clock signal $CLK_{RQL}$). Additionally, because the first and second linear flux-shuttles 506 and 508 include redundant sets of phased JTL stages that operate at the same phase of the clock signal $CLK_{RQL}$, the amplitude of the output current $I_{OUT}$ can be increased at a greater rate than a single set of JTLs at a given phase of the clock signal $CLK_{RQL}$. However, while each of the first and second linear flux-shuttles 506 and 508 include four sets of phased JTL stages, the current source system 500 can instead include more sets of phased JTL stages in each of the first and second linear flux-shuttles 506 and 508, or can include fewer sets of phased JTL stages (e.g., two in each of the first and second linear flux-shuttles 506 and 508 to correspond to the four phases of the clock signal $CLK_{RQL}$). Accordingly, the superconducting current source system 500 can be configured in any of a variety of ways based on a desired current compliance.

Figure 6:
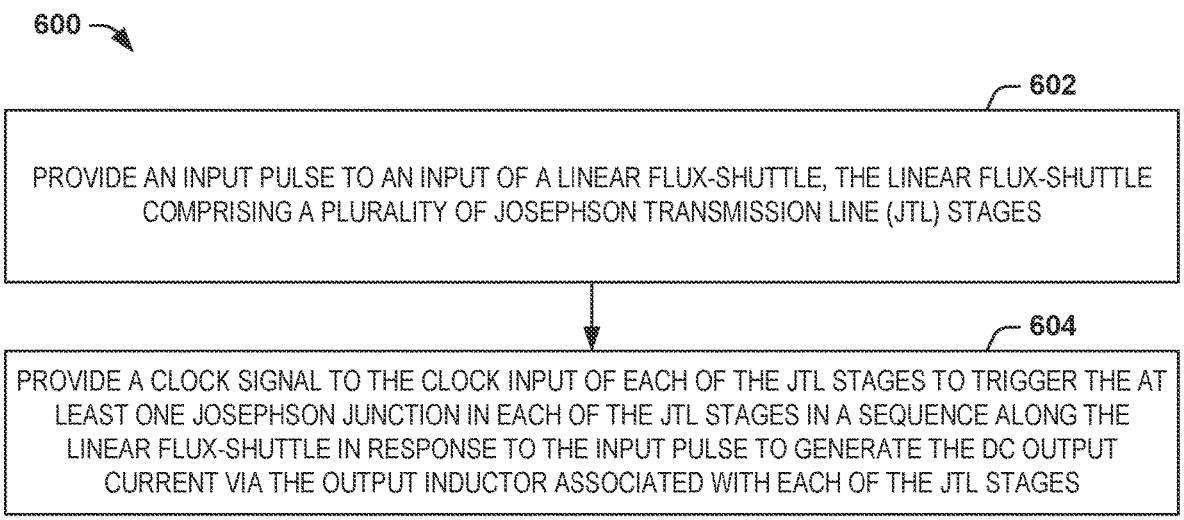
FIG. 6 illustrates an example of a method for generating a DC output current.

In view of the foregoing structural and functional features described above, a methodology in accordance with various aspects of the present invention will be better appreciated with reference to FIG. 6. While, for purposes of simplicity of explanation, the methodology of FIG. 6 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 6 illustrates an example of a method 600 for generating a DC output current (e.g., the DC output current $I_{OUT}$). At 602, an input pulse (e.g., the input pulse IN) is provided to an input of a linear flux-shuttle (e.g., the linear flux-shuttle 106). The linear flux-shuttle can include a plurality of Josephson transmission line (JTL) stages. Each of the JTL stages can include at least one Josephson junction (e.g., the Josephson junctions $J_{12\_X}$, etc.), an output inductor (e.g., the output inductor $L_{OUT\_X}$), and a clock input (e.g., the secondary winding $L_{SX}$). At 604, a clock signal (e.g., the clock signal CLK) is provided to the clock input of each of the JTL stages to trigger the at least one Josephson junction in each of the JTL stages in a sequence along the linear flux-shuttle in response to the input pulse to generate the DC output current via the output inductor associated with each of the JTL stages.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A superconducting current source system comprising a linear flux-shuttle, the linear flux-shuttle comprising an input and a plurality of Josephson transmission line (JTL) stages, each of the JTL stages comprising at least one Josephson junction, an output inductor, and a clock input, the linear flux-shuttle being configured to generate a direct current (DC) output current via the output inductor associated with each of the JTL stages in response to the at least one Josephson junction triggering in a sequence in each of the JTL stages along the linear flux-shuttle in response to receiving an input pulse at the input and in response to a clock signal provided to the clock input in each of the JTL stages.

2. The system of claim 1, wherein the linear flux-shuttle is a first linear flux-shuttle comprising a first input and a first plurality of JTL stages, each of the first JTL stages comprising at least one first Josephson junction, a first output inductor, and a first clock input, the superconducting current source system further comprising:

a second linear flux-shuttle comprising a second input and a second plurality of JTL stages, each of the second JTL stages comprising at least one second Josephson junction, a second output inductor, and a second clock input, wherein the first and second linear flux-shuttles are configured to generate the DC output current via the first output inductor associated with each of the first JTL stages and via the second output inductor associated with each of the second JTL stages in response to the respective at least one first and second Josephson junctions triggering in a sequence in each of the respective first and second JTL stages along the respective first and second linear flux-shuttles in response to receiving a first input pulse at the first input and a second input pulse at the second input and in response to the clock signal provided to the first and second clock inputs in each of the respective first and second JTL stages.

3. The system of claim 2, wherein the first input pulse and the second input pulse are 180° out-of-phase with respect to each other, such that the at least one first and second Josephson junctions alternately trigger in the sequence in each of the respective first and second JTL stages along the respective first and second linear flux-shuttles.

4. The system of claim 3, wherein the clock signal is an alternating current (AC) clock signal that is configured to trigger the at least one first Josephson junction in a first phase of the AC clock signal and to trigger the at least one second Josephson junction in a second phase of the AC clock signal opposite the first phase.

5. The system of claim 2, further comprising an output from which the DC output current is provided, wherein the first output inductor interconnects a respective one of the first JTL stages and the output to provide the DC output current and the second output inductor interconnects a respective one of the second JTL stages and the output to provide the DC output current.

6. The system of claim 1, wherein the at least one Josephson junction associated with each of the JTL stages comprises a plurality of Josephson junctions, and each of the plurality of JTL stages comprises at least one inductor to form at least one superconducting quantum interference device (SQUID) associated with each of the JTL stages.

7. The system of claim 6, wherein the Josephson junctions associated with each of the JTL stages is arranged as a shunted Josephson junction to provide a discrete current pulse as the DC output current via the respective output inductor in response to triggering in the sequence.

8. The system of claim 6, wherein Josephson junctions associated with each of the JTL stages is arranged as an unshunted Josephson junction to provide variable continuous current as the DC output current via the respective output inductor in response to triggering in the sequence, wherein a product of a critical current associated with one of the Josephson junctions and one of the inductors is less than one flux quantum.

9. The system of claim 1, wherein the JTL stages comprise first phased JTL stages that are associated with a first phase of the clock signal and second phased JTL stages that are associated with a second phase of the clock signal, wherein the linear flux-shuttle is configured to generate the DC output current via the output inductor associated with each of the first phased JTL stages in response to the at least one Josephson junction triggering in the sequence in each of the first phased JTL stages in response to the first phase of the clock signal, and to generate the DC output current via the output inductor associated with each of the second phased JTL stages in response to the at least one Josephson junction triggering in the sequence in each of the second phased JTL stages in response to the second phase of the clock signal.

10. The system of claim 9, wherein the clock signal is provided as an AC quadrature clock signal.

11. A method for generating a DC output current, the method comprising:
providing an input pulse to an input of a linear flux-shuttle, the linear flux-shuttle comprising a plurality of Josephson transmission line (JTL) stages, each of the JTL stages comprising at least one Josephson junction, an output inductor, and a clock input; and
providing a clock signal to the clock input of each of the JTL stages to trigger the at least one Josephson junction in each of the JTL stages in a sequence along the linear flux-shuttle in response to the input pulse to generate the DC output current via the output inductor associated with each of the JTL stages.

12. The method of claim 11, wherein the linear flux-shuttle is a first linear flux-shuttle comprising a first input and a first plurality of JTL stages, each of the first JTL stages comprising at least one first Josephson junction, a first output inductor, and a first clock input,
wherein providing the input pulse comprises providing the first input pulse to the first input of the first linear flux-shuttle and providing a second input pulse to a second input associated with a second linear flux-shuttle, the second linear flux-shuttle comprising a second plurality of JTL stages, each of the second JTL stages comprising at least one second Josephson junction, a second output inductor, and a second clock input,
wherein providing the clock signal comprises providing the clock signal to the first clock input associated with each of the first JTL stages to trigger the at least one first Josephson junction in each of the first JTL stages in a sequence along the first linear flux-shuttle in response to the first input pulse and providing the clock signal to the second clock input associated with each of the second JTL stages to trigger the at least one second Josephson junction in each of the second JTL stages in a sequence along the second linear flux-shuttle in response to the second input pulse to generate the DC output current via the first output inductor and the second output inductor associated with each of the respective first and second JTL stages.

13. The method of claim 12, wherein the clock signal is an alternating current (AC) clock signal, wherein the first input pulse and the second input pulse are 180° out-of-phase with respect to each other, such that the at least one first and second Josephson junctions alternately trigger in the sequence in each of the respective first and second JTL stages along the respective first and second linear flux-shuttles based on a respective first and second phase of the clock signal.

14. The method of claim 11, wherein the at least one Josephson junction associated with each of the JTL stages comprises a plurality of Josephson junctions, and each of the plurality of JTL stages comprises at least one inductor to form at least one superconducting quantum interference device (SQUID) associated with each of the JTL stages, wherein the Josephson junctions associated with each of the JTL stages is arranged as a shunted Josephson junction to provide a discrete current pulse as the DC output current via the respective output inductor in response to triggering in the sequence.

15. The method of claim 11, wherein the at least one Josephson junction associated with each of the JTL stages comprises a plurality of Josephson junctions, and each of the plurality of JTL stages comprises at least one inductor to form at least one superconducting quantum interference device (SQUID) associated with each of the JTL stages, wherein Josephson junctions associated with each of the JTL stages is arranged as an unshunted Josephson junction to provide variable continuous current as the DC output current via the respective output inductor in response to triggering in the sequence, wherein a product of a critical current associated with one of the Josephson junctions and one of the inductors is less than one flux quantum.

16. A superconducting current source system comprising:
a first linear flux-shuttle, the first linear flux-shuttle comprising a first input and a plurality of first Josephson transmission line (JTL) stages, each of the first JTL stages comprising at least one first Josephson junction, a first output inductor, and a first clock input;
a second linear flux-shuttle comprising a second input and a second plurality of JTL stages, each of the second JTL stages comprising at least one second Josephson junction, a second output inductor, and a second clock input; and
an output, the first and second linear flux-shuttles being configured to generate a DC output current on the output via the first output inductor associated with each of the first JTL stages and via the second output inductor associated with each of the second JTL stages in response to the respective at least one first and second Josephson junctions triggering in a sequence in each of the respective first and second JTL stages along the respective first and second linear flux-shuttles in response to receiving a first input pulse at the first input and a second input pulse at the second input and in response to the clock signal provided to the first and second clock inputs in each of the respective first and second JTL stages.

17. The system of claim 16, wherein the clock signal is an alternating current (AC) clock signal, wherein the first input pulse and the second input pulse are 180° out-of-phase with respect to each other, such that the at least one first and second Josephson junctions alternately trigger in the sequence in each of the respective first and second JTL stages along the respective first and second linear flux-shuttles based on a respective first and second phase of the clock signal.

18. The system of claim 16, wherein the at least one Josephson junction associated with each of the JTL stages comprises a plurality of Josephson junctions, and each of the plurality of JTL stages comprises at least one inductor to form at least one superconducting quantum interference device (SQUID) associated with each of the JTL stages, wherein the Josephson junctions associated with each of the JTL stages is arranged as a shunted Josephson junction to provide a discrete current pulse as the DC output current via the respective output inductor in response to triggering in the sequence.

19. The system of claim 16, wherein the at least one Josephson junction associated with each of the JTL stages comprises a plurality of Josephson junctions, and each of the plurality of JTL stages comprises at least one inductor to form at least one superconducting quantum interference device (SQUID) associated with each of the JTL stages, wherein Josephson junctions associated with each of the JTL stages is arranged as an unshunted Josephson junction to provide variable continuous current as the DC output current via the respective output inductor in response to triggering in the sequence, wherein a product of a critical current associated with one of the Josephson junctions and one of the inductors is less than one flux quantum.

20. The system of claim 16, wherein the clock signal is provided as an AC quadrature clock signal, wherein the first JTL stages comprises a plurality of first phased JTL stages that are associated with a first phase of the AC quadrature clock signal and second phased JTL stages that are associated with a second phase of the AC quadrature clock signal, wherein the second JTL stages comprises a plurality of third phased JTL stages that are associated with a third phase of the AC quadrature clock signal opposite the first phase and second phased JTL stages that are associated with a fourth phase of the AC quadrature clock signal opposite the second phase.

* * * * *